(12) United States Patent
Chen et al.

(10) Patent No.: US 7,262,133 B2
(45) Date of Patent: Aug. 28, 2007

(54) ENHANCEMENT OF COPPER LINE RELIABILITY USING THIN ALD TAN FILM TO CAP THE COPPER LINE

(75) Inventors: Ling Chen, Sunnyvale, CA (US); Mei Chang, Saratoga, CA (US)

(73) Assignee: Applied Materials, Inc., Santa Clara, CA (US)

( * ) Notice: Subject to any disclaimer, the term of this patent is extended or adjusted under 35 U.S.C. 154(b) by 396 days.

(21) Appl. No.: 10/741,824

(22) Filed: Dec. 19, 2003

(65) Prior Publication Data

US 2004/0187304 A1 Sep. 30, 2004

Related U.S. Application Data

(60) Provisional application No. 60/438,479, filed on Jan. 7, 2003.

(51) Int. Cl.
*H01L 21/44* (2006.01)
(52) U.S. Cl. .............. 438/653; 438/652; 438/687; 438/618; 257/750; 257/751; 257/E21.579
(58) Field of Classification Search ............... 438/652, 438/687, 618; 257/750, 751, E21.579
See application file for complete search history.

(56) References Cited

U.S. PATENT DOCUMENTS

| 4,058,430 A | 11/1977 | Suntola et al. |
|---|---|---|
| 4,389,973 A | 6/1983 | Suntola et al. |
| 4,413,022 A | 11/1983 | Suntola et al. |
| 4,486,487 A | 12/1984 | Skarp |
| 4,767,494 A | 8/1988 | Kobayashi et al. |
| 4,806,321 A | 2/1989 | Nishizawa et al. |
| 4,813,846 A | 3/1989 | Helms |
| 4,829,022 A | 5/1989 | Kobayashi et al. |
| 4,834,831 A | 5/1989 | Nishizawa et al. |
| 4,838,983 A | 6/1989 | Schumaker et al. |
| 4,838,993 A | 6/1989 | Aoki et al. |
| 4,840,921 A | 6/1989 | Matsumoto |
| 4,845,049 A | 7/1989 | Sunakawa |
| 4,859,307 A | 8/1989 | Nishizawa et al. |

(Continued)

FOREIGN PATENT DOCUMENTS

CN 1 319 891 11/2001

(Continued)

OTHER PUBLICATIONS

Ohba, et al., "Thermal Decomposition of Methylhydrazine and Deposition Properties of CVD TiN Thin Films", Conference Proceedings, Advanced Metallization for ULSI Applications in 1993 (1994), pp. 143-149.

(Continued)

*Primary Examiner*—George R. Fourson
*Assistant Examiner*—John M. Parker
(74) *Attorney, Agent, or Firm*—Patterson & Sheridan, LLP

(57) ABSTRACT

A method for depositing a cap layer over a metal-containing interconnect is provided. In one aspect, the cap layer is formed by introducing a pulse of a metal-containing compound followed by a pulse of a nitrogen-containing compound. In one aspect, the cap layer comprises tantalum nitride. The cap layer provides good barrier and adhesive properties, thereby enhancing the electrical performance and reliability of the interconnect.

23 Claims, 5 Drawing Sheets

U.S. PATENT DOCUMENTS

| | | | |
|---|---|---|---|
| 4,859,627 A | 8/1989 | Sunakawa | |
| 4,861,417 A | 8/1989 | Mochizuki et al. | |
| 4,876,218 A | 10/1989 | Pessa et al. | |
| 4,917,556 A | 4/1990 | Stark et al. | |
| 4,927,670 A | 5/1990 | Erbil | |
| 4,931,132 A | 6/1990 | Aspnes et al. | |
| 4,951,601 A | 8/1990 | Maydan et al. | |
| 4,960,720 A | 10/1990 | Shimbo | |
| 4,975,252 A | 12/1990 | Nishizawa et al. | |
| 4,993,357 A | 2/1991 | Scholz | |
| 5,000,113 A | 3/1991 | Wang et al. | |
| 5,013,683 A | 5/1991 | Petroff et al. | |
| 5,028,565 A | 7/1991 | Chang et al. | |
| 5,082,798 A | 1/1992 | Arimoto | |
| 5,085,885 A | 2/1992 | Foley et al. | |
| 5,091,320 A | 2/1992 | Aspnes et al. | |
| 5,130,269 A | 7/1992 | Kitahara et al. | |
| 5,166,092 A | 11/1992 | Mochizuki et al. | |
| 5,173,474 A | 12/1992 | Connell et al. | |
| 5,186,718 A | 2/1993 | Tepman et al. | |
| 5,205,077 A | 4/1993 | Wittstock | |
| 5,225,366 A | 7/1993 | Yoder | |
| 5,234,561 A | 8/1993 | Randhawa et al. | |
| 5,246,536 A | 9/1993 | Nishizawa et al. | |
| 5,250,148 A | 10/1993 | Nishizawa et al. | |
| 5,254,207 A | 10/1993 | Nishizawa et al. | |
| 5,256,244 A | 10/1993 | Ackerman | |
| 5,259,881 A | 11/1993 | Edwards et al. | |
| 5,270,247 A | 12/1993 | Sakuma et al. | |
| 5,278,435 A | 1/1994 | Van Hove et al. | |
| 5,281,274 A | 1/1994 | Yoder | |
| 5,286,296 A | 2/1994 | Sato et al. | |
| 5,290,609 A | 3/1994 | Horiike et al. | |
| 5,290,748 A | 3/1994 | Knuuttila et al. | |
| 5,294,286 A | 3/1994 | Nishizawa et al. | |
| 5,296,403 A | 3/1994 | Nishizawa et al. | |
| 5,300,186 A | 4/1994 | Kitahara et al. | |
| 5,306,666 A | 4/1994 | Izumi | |
| 5,311,055 A | 5/1994 | Goodman et al. | |
| 5,316,615 A | 5/1994 | Copel | |
| 5,316,793 A | 5/1994 | Wallace et al. | |
| 5,330,610 A | 7/1994 | Eres et al. | |
| 5,336,324 A | 8/1994 | Stall et al. | |
| 5,338,389 A | 8/1994 | Nishizawa et al. | |
| 5,348,911 A | 9/1994 | Jurgensen et al. | |
| 5,374,570 A | 12/1994 | Nasu et al. | |
| 5,395,791 A | 3/1995 | Cheng et al. | |
| 5,438,952 A | 8/1995 | Otsuka | |
| 5,439,876 A | 8/1995 | Graf et al. | |
| 5,441,703 A | 8/1995 | Jurgensen | |
| 5,443,033 A | 8/1995 | Nishizawa et al. | |
| 5,443,647 A | 8/1995 | Aucoin et al. | |
| 5,455,072 A | 10/1995 | Bension et al. | |
| 5,458,084 A | 10/1995 | Thorne et al. | |
| 5,469,806 A | 11/1995 | Mochizuki et al. | |
| 5,480,818 A | 1/1996 | Matsumoto et al. | |
| 5,483,919 A | 1/1996 | Yokoyama et al. | |
| 5,484,664 A | 1/1996 | Kitahara et al. | |
| 5,503,875 A | 4/1996 | Imai et al. | |
| 5,521,126 A | 5/1996 | Okamura et al. | |
| 5,526,244 A | 6/1996 | Bishop | |
| 5,527,733 A | 6/1996 | Nishizawa et al. | |
| 5,532,511 A | 7/1996 | Nishizawa et al. | |
| 5,540,783 A | 7/1996 | Eres et al. | |
| 5,580,380 A | 12/1996 | Liu et al. | |
| 5,601,651 A | 2/1997 | Watabe | |
| 5,609,689 A | 3/1997 | Kato et al. | |
| 5,616,181 A | 4/1997 | Yamamoto et al. | |
| 5,637,530 A | 6/1997 | Gaines et al. | |
| 5,641,984 A | 6/1997 | Aftergut et al. | |
| 5,644,128 A | 7/1997 | Wollnik et al. | |
| 5,667,592 A | 9/1997 | Boitnott et al. | |
| 5,674,786 A | 10/1997 | Turner et al. | |
| 5,693,139 A | 12/1997 | Nishizawa et al. | |
| 5,695,564 A | 12/1997 | Imahashi | |
| 5,705,224 A | 1/1998 | Murota et al. | |
| 5,707,880 A | 1/1998 | Aftergut et al. | |
| 5,711,811 A | 1/1998 | Suntola et al. | |
| 5,730,801 A | 3/1998 | Tepman et al. | |
| 5,730,802 A | 3/1998 | Ishizumi et al. | |
| 5,747,113 A | 5/1998 | Tsai | |
| 5,749,974 A | 5/1998 | Habuka et al. | |
| 5,788,447 A | 8/1998 | Yonemitsu et al. | |
| 5,788,799 A | 8/1998 | Steger et al. | |
| 5,796,116 A | 8/1998 | Nakata et al. | |
| 5,801,634 A | 9/1998 | Young et al. | |
| 5,804,488 A | 9/1998 | Shih et al. | |
| 5,807,792 A | 9/1998 | Ilg et al. | |
| 5,830,270 A | 11/1998 | McKee et al. | |
| 5,835,677 A | 11/1998 | Li et al. | |
| 5,851,849 A | 12/1998 | Comizzoli et al. | |
| 5,855,675 A | 1/1999 | Doering et al. | |
| 5,855,680 A | 1/1999 | Soininen et al. | |
| 5,856,219 A | 1/1999 | Naito et al. | |
| 5,858,102 A | 1/1999 | Tsai | |
| 5,866,213 A | 2/1999 | Foster et al. | |
| 5,866,795 A | 2/1999 | Wang et al. | |
| 5,879,459 A | 3/1999 | Gadgil et al. | |
| 5,882,165 A | 3/1999 | Maydan et al. | |
| 5,882,413 A | 3/1999 | Beaulieu et al. | |
| 5,916,365 A | 6/1999 | Sherman | |
| 5,923,056 A | 7/1999 | Lee et al. | |
| 5,923,985 A | 7/1999 | Aoki et al. | |
| 5,925,574 A | 7/1999 | Aoki et al. | |
| 5,928,389 A | 7/1999 | Jevtic | |
| 5,942,040 A | 8/1999 | Kim et al. | |
| 5,947,710 A | 9/1999 | Cooper et al. | |
| 5,972,430 A | 10/1999 | DiMeo, Jr. et al. | |
| 6,001,669 A | 12/1999 | Gaines et al. | |
| 6,013,553 A | 1/2000 | Wallace et al. | |
| 6,015,590 A | 1/2000 | Suntola et al. | |
| 6,015,917 A | 1/2000 | Bhandari et al. | |
| 6,020,243 A | 2/2000 | Wallace et al. | |
| 6,025,627 A | 2/2000 | Forbes et al. | |
| 6,036,773 A | 3/2000 | Wang et al. | |
| 6,037,664 A | 3/2000 | Zhao et al. | |
| 6,042,652 A | 3/2000 | Hyun et al. | |
| 6,043,177 A | 3/2000 | Falconer et al. | |
| 6,051,286 A | 4/2000 | Zhao et al. | |
| 6,062,798 A | 5/2000 | Muka | |
| 6,071,808 A | 6/2000 | Merchant et al. | |
| 6,084,302 A | 7/2000 | Sandhu | |
| 6,086,677 A | 7/2000 | Umotoy et al. | |
| 6,110,556 A | 8/2000 | Bang et al. | |
| 6,113,771 A | 9/2000 | Landau et al. | |
| 6,113,977 A | 9/2000 | Soininen et al. | |
| 6,117,244 A | 9/2000 | Bang et al. | |
| 6,124,158 A | 9/2000 | Dautartas et al. | |
| 6,130,147 A | 10/2000 | Major et al. | |
| 6,139,700 A | 10/2000 | Kang et al. | |
| 6,140,237 A | 10/2000 | Chan et al. | |
| 6,140,238 A | 10/2000 | Kitch | |
| 6,143,659 A | 11/2000 | Leem | |
| 6,144,060 A | 11/2000 | Park et al. | |
| 6,158,446 A | 12/2000 | Mohindra et al. | |
| 6,169,028 B1 | 1/2001 | Wang et al. | |
| 6,174,377 B1 | 1/2001 | Doering et al. | |
| 6,174,809 B1 | 1/2001 | Kang et al. | |
| 6,174,812 B1 | 1/2001 | Hsiung et al. | |
| 6,197,678 B1 | 3/2001 | Yu | |
| 6,197,683 B1 | 3/2001 | Kang et al. | |
| 6,200,893 B1 | 3/2001 | Sneh | |
| 6,203,613 B1 * | 3/2001 | Gates et al. | 117/104 |
| 6,204,168 B1 * | 3/2001 | Naik et al. | 438/638 |

| | | | | | |
|---|---|---|---|---|---|
| 6,206,967 B1 | 3/2001 | Mak et al. | 2001/0021589 A1 | 9/2001 | Wilk |
| 6,207,302 B1 | 3/2001 | Sugiura et al. | 2001/0024387 A1 | 9/2001 | Raaijmakers et al. |
| 6,207,487 B1 | 3/2001 | Kim et al. | 2001/0025979 A1 | 10/2001 | Kim et al. |
| 6,218,298 B1 | 4/2001 | Hoinkis | 2001/0028924 A1 | 10/2001 | Sherman |
| 6,238,734 B1 | 5/2001 | Senzaki et al. | 2001/0029094 A1 | 10/2001 | Mee-Young et al. |
| 6,248,605 B1 | 6/2001 | Harkonen et al. | 2001/0029891 A1 | 10/2001 | Oh et al. |
| 6,258,713 B1 | 7/2001 | Yu et al. | 2001/0031562 A1 | 10/2001 | Raaijmakers et al. |
| 6,270,572 B1 | 8/2001 | Kim et al. | 2001/0034123 A1 | 10/2001 | Jeon et al. |
| 6,271,148 B1 | 8/2001 | Kao et al. | 2001/0041250 A1 | 11/2001 | Werkhoven et al. |
| 6,284,646 B1 | 9/2001 | Leem | 2001/0050039 A1 | 12/2001 | Park |
| 6,287,965 B1 | 9/2001 | Kang et al. | 2001/0052752 A1 | 12/2001 | Ghosh et al. |
| 6,291,283 B1 | 9/2001 | Wilk | 2001/0054730 A1 | 12/2001 | Kim et al. |
| 6,291,876 B1 | 9/2001 | Stumborg et al. | 2001/0054769 A1 | 12/2001 | Raaijmakers et al. |
| 6,299,294 B1 | 10/2001 | Regan | 2002/0000598 A1 | 1/2002 | Kang et al. |
| 6,305,314 B1 | 10/2001 | Sneh et al. | 2002/0004293 A1 | 1/2002 | Soininen et al. |
| 6,306,216 B1 | 10/2001 | Kim et al. | 2002/0005556 A1 | 1/2002 | Cartier et al. |
| 6,316,098 B1 | 11/2001 | Yitzchaik et al. | 2002/0007790 A1 | 1/2002 | Park |
| 6,333,260 B1 | 12/2001 | Kwon et al. | 2002/0008297 A1 | 1/2002 | Park et al. |
| 6,335,280 B1 | 1/2002 | van der Jeugh | 2002/0014647 A1 | 2/2002 | Seidl et al. |
| 6,342,277 B1 | 1/2002 | Sherman | 2002/0015790 A1 | 2/2002 | Baum et al. |
| 6,348,376 B2 | 2/2002 | Lim et al. | 2002/0019121 A1 | 2/2002 | Pyo |
| 6,348,386 B1 | 2/2002 | Gilmer | 2002/0020869 A1 | 2/2002 | Park et al. |
| 6,355,561 B1 | 3/2002 | Sandhu et al. | 2002/0021544 A1 | 2/2002 | Cho et al. |
| 6,358,829 B2 | 3/2002 | Yoon et al. | 2002/0029092 A1 | 3/2002 | Gass |
| 6,358,849 B1 * | 3/2002 | Havemann et al. ......... 438/689 | 2002/0031618 A1 | 3/2002 | Sherman |
| 6,368,954 B1 | 4/2002 | Lopatin et al. | 2002/0037630 A1 | 3/2002 | Agarwal et al. |
| 6,369,430 B1 | 4/2002 | Adetutu et al. | 2002/0041931 A1 | 4/2002 | Suntola et al. |
| 6,372,598 B2 | 4/2002 | Kang et al. | 2002/0043666 A1 | 4/2002 | Parsons et al. |
| 6,376,353 B1 | 4/2002 | Zhou et al. | 2002/0048635 A1 | 4/2002 | Kim et al. |
| 6,379,748 B1 | 4/2002 | Bhandari et al. | 2002/0048880 A1 | 4/2002 | Lee |
| 6,380,084 B1 | 4/2002 | Lim et al. | 2002/0052097 A1 | 5/2002 | Park |
| 6,391,785 B1 | 5/2002 | Satta et al. | 2002/0055235 A1 | 5/2002 | Agarwal et al. |
| 6,391,803 B1 | 5/2002 | Kim et al. | 2002/0061612 A1 | 5/2002 | Sandhu et al. |
| 6,395,650 B1 | 5/2002 | Callegari et al. | 2002/0064970 A1 | 5/2002 | Chooi et al. |
| 6,399,491 B2 | 6/2002 | Jeon et al. | 2002/0068458 A1 | 6/2002 | Chiang et al. |
| 6,416,577 B1 | 7/2002 | Suntoloa et al. | 2002/0073924 A1 | 6/2002 | Chiang et al. |
| 6,416,822 B1 | 7/2002 | Chiang et al. | 2002/0074588 A1 | 6/2002 | Lee et al. |
| 6,420,189 B1 | 7/2002 | Lopatin | 2002/0076481 A1 | 6/2002 | Chiang et al. |
| 6,420,279 B1 | 7/2002 | Ono et al. | 2002/0076507 A1 | 6/2002 | Chiang et al. |
| 6,423,619 B1 | 7/2002 | Grant et al. | 2002/0076508 A1 | 6/2002 | Chiang et al. |
| 6,426,555 B1 | 7/2002 | Hsia | 2002/0076837 A1 | 6/2002 | Hujanen et al. |
| 6,428,859 B1 | 8/2002 | Chiang et al. | 2002/0081826 A1 | 6/2002 | Rotondaro et al. |
| 6,447,933 B1 | 9/2002 | Wang et al. | 2002/0081844 A1 | 6/2002 | Jeon et al. |
| 6,451,119 B2 | 9/2002 | Sneh et al. | 2002/0086111 A1 | 7/2002 | Byun et al. |
| 6,451,695 B2 | 9/2002 | Sneh | 2002/0086507 A1 | 7/2002 | Park et al. |
| 6,452,229 B1 | 9/2002 | Krivokapic | 2002/0090829 A1 | 7/2002 | Sandhu et al. |
| 6,458,701 B1 | 10/2002 | Chae et al. | 2002/0093046 A1 | 7/2002 | Moriya et al. |
| 6,468,924 B2 | 10/2002 | Lee et al. | 2002/0093781 A1 | 7/2002 | Bachhofer et al. |
| 6,475,276 B1 | 11/2002 | Elers et al. | 2002/0094689 A1 | 7/2002 | Park |
| 6,475,910 B1 | 11/2002 | Sneh | 2002/0096775 A1 | 7/2002 | Ning |
| 6,478,872 B1 | 11/2002 | Chae et al. | 2002/0098627 A1 | 7/2002 | Pomarede et al. |
| 6,482,262 B1 | 11/2002 | Elers et al. | 2002/0102834 A1 | 8/2002 | Yang et al. |
| 6,482,733 B2 | 11/2002 | Raaijmakers et al. | 2002/0102840 A1 | 8/2002 | Tsai et al. |
| 6,482,740 B2 | 11/2002 | Soininen et al. | 2002/0104481 A1 | 8/2002 | Chiang et al. |
| 6,511,539 B1 | 1/2003 | Raaijmakers et al. | 2002/0105088 A1 | 8/2002 | Yang et al. |
| 6,518,167 B1 * | 2/2003 | You et al. .................. 438/622 | 2002/0106536 A1 | 8/2002 | Lee et al. |
| 6,534,395 B2 | 3/2003 | Werkhoven et al. | 2002/0106846 A1 | 8/2002 | Seutter et al. |
| 6,548,424 B2 | 4/2003 | Putkonen | 2002/0109168 A1 | 8/2002 | Kim et al. |
| 6,573,179 B1 * | 6/2003 | Wang et al. ................ 438/652 | 2002/0117399 A1 | 8/2002 | Chen et al. |
| 6,585,823 B1 | 7/2003 | Van Wijck | 2002/0121241 A1 | 9/2002 | Nguyen et al. |
| 6,599,572 B2 | 7/2003 | Saanila et al. | 2002/0121342 A1 | 9/2002 | Nguyen et al. |
| 6,607,976 B2 | 8/2003 | Chen et al. | 2002/0121697 A1 | 9/2002 | Marsh |
| 6,620,723 B1 | 9/2003 | Byun et al. | 2002/0135071 A1 | 9/2002 | Kang et al. |
| 6,632,279 B1 | 10/2003 | Ritala et al. | 2002/0144655 A1 | 10/2002 | Chiang et al. |
| 6,660,126 B2 | 12/2003 | Nguyen et al. | 2002/0144657 A1 | 10/2002 | Chiang et al. |
| 6,686,271 B2 | 2/2004 | Raaijmakers et al. | 2002/0146511 A1 | 10/2002 | Chiang et al. |
| 6,706,625 B1 * | 3/2004 | Sudijono et al. ............ 438/637 | 2002/0146895 A1 | 10/2002 | Ramdani et al. |
| 6,734,559 B1 * | 5/2004 | Yang et al. ................. 257/751 | 2002/0151152 A1 | 10/2002 | Shimamoto et al. |
| 2001/0000866 A1 | 5/2001 | Sneh et al. | 2002/0153579 A1 | 10/2002 | Yamamoto |
| 2001/0002280 A1 | 5/2001 | Sneh | 2002/0155722 A1 | 10/2002 | Satta et al. |
| 2001/0009140 A1 | 7/2001 | Bondestam et al. | 2002/0162506 A1 | 11/2002 | Sneh et al. |
| 2001/0009695 A1 | 7/2001 | Saanila et al. | 2002/0164421 A1 | 11/2002 | Chiang et al. |
| 2001/0011526 A1 | 8/2001 | Doering et al. | 2002/0164423 A1 | 11/2002 | Chiang et al. |

| | | | | | | |
|---|---|---|---|---|---|---|
| 2002/0177282 | A1 | 11/2002 | Song | JP | 01-103996 | 4/1989 |
| 2002/0182320 | A1 | 12/2002 | Leskela et al. | JP | 64-090524 | 4/1989 |
| 2002/0187256 | A1 | 12/2002 | Elers et al. | JP | 01-117017 | 5/1989 |
| 2002/0187631 | A1 | 12/2002 | Kim et al. | JP | 01-143221 | 6/1989 |
| 2002/0197402 | A1 | 12/2002 | Chiang et al. | JP | 01-143233 | 6/1989 |
| 2003/0013300 | A1 | 1/2003 | Byun | JP | 01-154511 | 6/1989 |
| 2003/0013320 | A1 | 1/2003 | Kim et al. | JP | 01-236657 | 9/1989 |
| 2003/0031807 | A1 | 2/2003 | Elers et al. | JP | 01-245512 | 9/1989 |
| 2003/0032281 | A1 | 2/2003 | Werkhoven et al. | JP | 01-264218 | 10/1989 |
| 2003/0042630 | A1 | 3/2003 | Babcoke et al. | JP | 01-270593 | 10/1989 |
| 2003/0049942 | A1 | 3/2003 | Haukka et al. | JP | 01-272108 | 10/1989 |
| 2003/0054631 | A1 | 3/2003 | Raaijmakers et al. | JP | 01-290221 | 11/1989 |
| 2003/0072975 | A1 | 4/2003 | Shero et al. | JP | 01-290222 | 11/1989 |
| 2003/0079686 | A1 | 5/2003 | Chen et al. | JP | 01-296673 | 11/1989 |
| 2003/0082296 | A1 | 5/2003 | Elers et al. | JP | 01-303770 | 12/1989 |
| 2003/0082300 | A1 | 5/2003 | Todd et al. | JP | 01-305894 | 12/1989 |
| 2003/0089308 | A1 | 5/2003 | Raaijmakers | JP | 01-313927 | 12/1989 |
| 2003/0101927 | A1 | 6/2003 | Raaijmakers | JP | 02-012814 | 1/1990 |
| 2003/0104126 | A1 | 6/2003 | Fang et al. | JP | 02-014513 | 1/1990 |
| 2003/0129826 | A1 | 7/2003 | Werkhoven et al. | JP | 02-017634 | 1/1990 |
| 2003/0134508 | A1 | 7/2003 | Raaijmakers et al. | JP | 02-063115 | 3/1990 |
| 2003/0143839 | A1 | 7/2003 | Jones et al. | JP | 02-074029 | 3/1990 |
| 2003/0143841 | A1 | 7/2003 | Yang et al. | JP | 02-074587 | 3/1990 |
| 2003/0165615 | A1 | 9/2003 | Aaltonen et al. | JP | 02-106822 | 4/1990 |
| 2003/0168750 | A1 | 9/2003 | Basceri et al. | JP | 02-129913 | 5/1990 |
| 2003/0173586 | A1 | 9/2003 | Henderson | JP | 02-162717 | 6/1990 |
| 2003/0186495 | A1 | 10/2003 | Saanila et al. | JP | 02-172895 | 7/1990 |
| 2003/0205729 | A1 | 11/2003 | Basceri et al. | JP | 02-196092 | 8/1990 |
| 2004/0113279 | A1 * | 6/2004 | Chen et al. .......... 257/774 | JP | 02-203517 | 8/1990 |
| | | | | JP | 02-230690 | 9/1990 |
| | | FOREIGN PATENT DOCUMENTS | | JP | 02-230722 | 9/1990 |
| | | | | JP | 02-246161 | 10/1990 |
| DE | 196 27 017 A1 | 1/1997 | | JP | 02-264491 | 10/1990 |
| DE | 198 20 147 A1 | 7/1999 | | JP | 02-283084 | 11/1990 |
| EP | 0 344 352 A1 | 6/1988 | | JP | 02-304916 | 12/1990 |
| EP | 0 442 490 A1 | 2/1991 | | JP | 03-019211 | 1/1991 |
| EP | 0 429 270 A2 | 5/1991 | | JP | 03-022569 | 1/1991 |
| EP | 0 799 641 A2 | 10/1997 | | JP | 03-023294 | 1/1991 |
| EP | 1 146 141 A2 | 10/2001 | | JP | 03-023299 | 1/1991 |
| EP | 1 167 569 A1 | 1/2002 | | JP | 03-044967 | 2/1991 |
| EP | 1 170 804 A2 | 1/2002 | | JP | 03-048421 | 3/1991 |
| FR | 2 626 110 A1 | 7/1989 | | JP | 03-070124 | 3/1991 |
| FR | 2 692 597 A1 | 12/1993 | | JP | 03-185716 | 8/1991 |
| GB | 2 355 727 A | 5/2001 | | JP | 03-208885 | 9/1991 |
| GB | 2365215 | 2/2002 | | JP | 03-234025 | 10/1991 |
| JP | 58-098917 | 6/1983 | | JP | 03-286522 | 12/1991 |
| JP | 58-100419 | 6/1983 | | JP | 03-286531 | 12/1991 |
| JP | 60-065712 A | 4/1985 | | JP | 04-031391 | 2/1992 |
| JP | 61-035847 | 2/1986 | | JP | 04-031396 | 2/1992 |
| JP | 61-210623 | 9/1986 | | JP | 04-100292 | 4/1992 |
| JP | 62-069508 | 3/1987 | | JP | 04-111418 | 4/1992 |
| JP | 62-091495 | 4/1987 | | JP | 04-132214 | 5/1992 |
| JP | 62-141717 | 6/1987 | | JP | 04-132681 | 5/1992 |
| JP | 62-167297 | 7/1987 | | JP | 04-151822 | 5/1992 |
| JP | 62-171999 | 7/1987 | | JP | 04-162418 | 6/1992 |
| JP | 62-232919 | 10/1987 | | JP | 04-175299 | 6/1992 |
| JP | 63-062313 | 3/1988 | | JP | 04-186824 | 7/1992 |
| JP | 63-085098 | 4/1988 | | JP | 04-212411 | 8/1992 |
| JP | 63-090833 | 4/1988 | | JP | 04-260696 | 9/1992 |
| JP | 63-222420 | 9/1988 | | JP | 04-273120 | 9/1992 |
| JP | 63-222421 | 9/1988 | | JP | 04-285167 | 10/1992 |
| JP | 63-227007 | 9/1988 | | JP | 04-291916 | 10/1992 |
| JP | 63-252420 | 10/1988 | | JP | 04-325500 | 11/1992 |
| JP | 63-266814 | 11/1988 | | JP | 04-328874 | 11/1992 |
| JP | 64-009895 | 1/1989 | | JP | 05-029228 | 2/1993 |
| JP | 64-009896 | 1/1989 | | JP | 05-047665 | 2/1993 |
| JP | 64-009897 | 1/1989 | | JP | 05-047666 | 2/1993 |
| JP | 64-037832 | 2/1989 | | JP | 05-047668 | 2/1993 |
| JP | 64-082615 | 3/1989 | | JP | 05-074717 | 3/1993 |
| JP | 64-082617 | 3/1989 | | JP | 05-074724 | 3/1993 |
| JP | 64-082671 | 3/1989 | | JP | 05-102189 | 4/1993 |
| JP | 64-082676 | 3/1989 | | JP | 05-160152 | 6/1993 |
| JP | 01-103982 | 4/1989 | | JP | 05-175143 | 7/1993 |

| | | |
|---|---|---|
| JP | 05-175145 | 7/1993 |
| JP | 05-182906 | 7/1993 |
| JP | 05-186295 | 7/1993 |
| JP | 05-206036 | 8/1993 |
| JP | 05-234899 | 9/1993 |
| JP | 05-235047 | 9/1993 |
| JP | 05-251339 | 9/1993 |
| JP | 05-270997 | 10/1993 |
| JP | 05-283336 | 10/1993 |
| JP | 05-291152 | 11/1993 |
| JP | 05-304334 | 11/1993 |
| JP | 05-343327 | 12/1993 |
| JP | 05-343685 | 12/1993 |
| JP | 06-045606 | 2/1994 |
| JP | 06-132236 | 5/1994 |
| JP | 06-177381 | 6/1994 |
| JP | 06-196809 | 7/1994 |
| JP | 06-222388 | 8/1994 |
| JP | 06-224138 | 8/1994 |
| JP | 06-230421 | 8/1994 |
| JP | 06-252057 | 9/1994 |
| JP | 06-291048 | 10/1994 |
| JP | 07-070752 | 3/1995 |
| JP | 07-086269 | 3/1995 |
| JP | 07-300649 | 11/1995 |
| JP | 08-181076 | 7/1996 |
| JP | 08-245291 | 9/1996 |
| JP | 08-264530 | 10/1996 |
| JP | 09-260786 | 10/1997 |
| JP | 09-293681 | 11/1997 |
| JP | 10-188840 | 7/1998 |
| JP | 10-190128 | 7/1998 |
| JP | 10-308283 | 11/1998 |
| JP | 11-269652 | 10/1999 |
| JP | 2000-031387 | 1/2000 |
| JP | 2000-058777 | 2/2000 |
| JP | 2000-068072 | 3/2000 |
| JP | 2000-087029 | 3/2000 |
| JP | 2000-138094 | 5/2000 |
| JP | 2000-178735 | 6/2000 |
| JP | 2000-218445 | 8/2000 |
| JP | 2000-319772 | 11/2000 |
| JP | 2000-340883 | 12/2000 |
| JP | 2000-353666 | 12/2000 |
| JP | 2001-020075 | 1/2001 |
| JP | 2001-62244 | 3/2001 |
| JP | 2001-111000 | 4/2001 |
| JP | 2001-152339 | 6/2001 |
| JP | 2001-172767 | 6/2001 |
| JP | 2001-189312 | 7/2001 |
| JP | 2001-217206 | 8/2001 |
| JP | 2001-220287 | 8/2001 |
| JP | 2001-220294 | 8/2001 |
| JP | 2001-254181 | 9/2001 |
| JP | 2001-284042 | 10/2001 |
| JP | 2001-303251 | 10/2001 |
| JP | 2001-313296 | 11/2001 |
| JP | 2001-328900 | 11/2001 |
| JP | 2002-60944 | 2/2002 |
| JP | 2002-69641 | 3/2002 |
| JP | 2002-93804 | 3/2002 |
| JP | 2002-167672 | 6/2002 |
| JP | 2002-172767 | 6/2002 |
| TW | 430970 | 4/2001 |
| WO | WO90/02216 | 3/1990 |
| WO | WO91/10510 | 7/1991 |
| WO | WO93/02111 | 2/1993 |
| WO | WO96/17107 | 6/1996 |
| WO | WO96/17107 A1 | 6/1996 |
| WO | WO96/18756 | 6/1996 |
| WO | WO98/06889 | 2/1998 |
| WO | WO98/51838 | 11/1998 |
| WO | WO98/51838 A1 | 11/1998 |
| WO | WO99/01595 A1 | 1/1999 |
| WO | WO99/13504 | 3/1999 |
| WO | WO99/29924 | 6/1999 |
| WO | WO99/41423 | 8/1999 |
| WO | WO99/65064 A1 | 12/1999 |
| WO | WO 00/11721 | 3/2000 |
| WO | WO 00/15865 A1 | 3/2000 |
| WO | WO 00/15881 A2 | 3/2000 |
| WO | WO 00/16377 A2 | 3/2000 |
| WO | WO 00/54320 A1 | 9/2000 |
| WO | WO 00/63957 A1 | 10/2000 |
| WO | WO 00/70674 | 11/2000 |
| WO | WO 00/79019 A1 | 12/2000 |
| WO | WO 00/79576 A1 | 12/2000 |
| WO | WO 01/15220 | 3/2001 |
| WO | WO 01/15220 A1 | 3/2001 |
| WO | WO 01/17692 A1 | 3/2001 |
| WO | WO 01/25502 A1 | 4/2001 |
| WO | WO 01/27346 A1 | 4/2001 |
| WO | WO 01/27347 A1 | 4/2001 |
| WO | WO 01/29280 A1 | 4/2001 |
| WO | WO 01/29891 A1 | 4/2001 |
| WO | WO 01/29893 A1 | 4/2001 |
| WO | WO 01/36702 A1 | 5/2001 |
| WO | WO 01/40541 A1 | 6/2001 |
| WO | WO 01/66832 A2 | 9/2001 |
| WO | WO 01/82390 A1 | 11/2001 |
| WO | WO 02/01628 A2 | 1/2002 |
| WO | WO 02/08485 A2 | 1/2002 |
| WO | WO 02/09167 A2 | 1/2002 |
| WO | WO 02/27063 A2 | 4/2002 |
| WO | WO 02/43115 A2 | 5/2002 |
| WO | WO 02/45167 A2 | 6/2002 |
| WO | WO 02/45871 A1 | 6/2002 |
| WO | WO 02/067319 A2 | 8/2002 |

OTHER PUBLICATIONS

Scheper, et al.,"Low-temperature deposition of titanium nitride films from dialkylhydrazine-based precursors", Materials Science in Semiconductor Processing 2 (1999), pp. 149-157.

Suzuki, et al., "A 0.2-μm contact filing by 450° C.-hydrazine-reduced TiN film with low resistivity", IEDM 92-979, pp. 11.8.1-11.8.3 (1992).

Suzuki, et al., "LPCVD-TiN Using Hydrazine and $TiCl_4$", VMIC Conference (Jun. 8-9, 1993), pp. 418-423.

IBM Tech. Disc. Bull. Knowledge-Based Dynamic Scheduler in Distributed Computer Control, (Jun. 1990), pp. 80-84.

IBM Tech. Disc. Bull. "Multiprocessor and Multitasking Architecture for Tool Control of the Advanced via Inspection Tools" (May 1992), pp. 190-191.

McGeachin, S., "Synthesis and properties of some β-diketimines derived from acetylacetone, and their metal complexes", Canadian J. of Chemistry, vol. 46 (1968), pp. 1903-1912.

Solanki, et al., "Atomic Layer deposition of Copper Seed Layers", Electrochemical and Solid State Letters, 3(10) (2000), pp. 479-480.

Yang, et al. "Atomic Layer Deposition of Tungsten Film from WF6/B2H6:Nucleation Layer for Advanced Semiconductor Device," Conference Proceedings ULSI XVII (2002) Materials Research Society.

Kukli, et al. "Tailoring the Dielectric Properties of $HfO_2$-$Ta_2$-$O_5$ Nanolaminates," Applied Physics Letters, vol. 68, No. 26, Jun. 24, 1996; pp. 3737-3739.

Kukli, et al. "Atomic Layer Epitaxy Growth of Tantalum Oxide Thin Films from $Ta(OC_2H_5)5$ and $H_2O$," Journal of the Electrochemical Society, Vo. 142, No. 5, May 1995: pp. 1670-1675.

Kukli, et al. "Properties of $Ta_2O_5$-Based Dielectric Nanolaminates Deposited by Atomic Layer Epitaxy," Journal of Electrochemical Society, vol. 144, No. 1, Jan. 1997; pp. 300-306.

Kukli, et al. "In Situ Study of Atomic Layer Epitaxy Growth on Tantalum Oxide Thin Films form $Ta(OC_2H_5)_5$ and $H_2O$," Applied Surface Science, vol. 112, Mar. 1997, pp. 236-242.

Kukli, et al. "Properties of {Nb$_{1-x}$ Ta$_x$}$_2$O$_5$ Solid Solutions and {Nb$_{1-x}$ Ta$_x$}$_2$O$_5$Z$_r$O$_2$ Nanolaminates Grown by Atomic Layer Epitaxy," 1997; p. 785-93.

Eisenbraum, et al. "Atomic Layer Deposition (ALD) of Tantalum-based Materials for Zero Thickness Copper Barrier Applications," Proceedings of the IEEE 2001 International Interconnect Technology Conference 2001.

Clark-Phelps, et al. "Engineered Tantalum Aluminate and Hafnium Aluminate ALD Films for Ultrathin Dilectric Films with Improved Electrical and Thermal Properties," Mat. Res. Soc. Symp. Proc. vol. 670 (2001).

Rossnagel, et al. "Plasma-enhanced Atomic Layer Deposition of Ta and Ti for Interconnect Diffusion Barriers," J. Vacuum Sci. & Tech. B., vol. 18, No. 4 (Jul. 2000), pp. 2016-2020.

Bader, et al., "Integrated Processing Equipment", Solid State Technology, Cowan Pub., vol. 33, No. 5 (May 1, 1990), pp. 149-154.

Choi, et al., "The effect of annealing on resistivity of low pressure chemical vapor depositied titanium diboride", J. Appl. Phys. 69(11) (Jun. 1, 1991), pp. 7853-7861.

Choi, et al., "Stability of TiB$_2$ as a Diffusion Barrier on Silicon", J. Electrochem. Soc. 138(10) (Oct. 1991), pp. 3062-3067.

Dan Maydan, "Cluster Tools for Fabrication of Advanced Devices" Jap. J. of Applied Physics, Extended Abstracts, 22$^{nd}$ Conference Solid State Devices and Materials (1990), pp. 849-852.

Katherine Derbyshire "Applications of Integrated Processing", Solid State Technology, US, Cowan Pub., vol. 37, No. 12 (Dec. 1, 1994), pp. 45-47.

Kitigawa, et al., "Hydrogen-mediated low temperature epitaxy of Si in plasma-enhanced chemical vapor deposition", Applied Surface Science (2000), pp. 30-34.

J.W. Klaus, et al., "Atomically controlled growth of tungsten and tungsten nitride using sequential surface reactions", Applied Surface Science 162-163, 2000, pp. 479-491.

M. Ritala, et al., "Perfectly Conformal TiN and Al$_2$O$_3$ Films Deposited by Atomic Layer Deposition", Chemical Vapor Deposition, ISSN 0948-1907, CVDEFX, vol. 5, Jan. 1999, No. 1, pp. 7-9.

L. Niinisto, et al., "Synthesis of oxide thin films and overlayers by atomic layer epitaxy for advanced applications", Materials Science and Engineering B41, 1996, pp. 23-29.

M. Balog, et al., "Chemical Vapor Deposition and Characterization of HfO$_2$ Films From Organo-Hafnium Compounds", Thin Solid Films, 41, 1977, pp. 247-259.

Y. Ohshita, et al., "HfO$_2$ growth by low=pressure chemical vapor deposition using the Hf(N(C$_2$H$_5$)$_2$)$_4$/O$_2$ gas system", Journal of Crystal Growth 233, 2001, pp. 292-297.

Lee, et al., "Pulsed nucleation for ultra-high aspect ratio tungsten plugfill", Novellus Systems, Inc. (2001), pp. 1-2.

Mikko Ritala, et al. "Development of Crystallinity and Morphology in Hafnium Dioxide Thin Films Grown by Atomic Layer Epitaxy", 1994 Thin Solid Films, 250 pp. 72-80.

Mikko Ritala, "Thesis. Ann. Acad. Sci. Fenn. Ser. AII" Chemica, 257, May 1994 pp. 1-48.

PCT International Search Report for PCT/US02/28884, Sep. 23, 2003.

Hultman, et al., "Review of the thermal and mechanical stability of TiN-based thin films", Zeitschrift Fur Metallkunde, 90(10) (Oct. 1999), pp. 803-813.

Klaus, et al., "Atomic Layer Deposition of SiO$_2$ Using Catalyzed and Uncatalyzed Self-Limiting Surface Reactions", Surface Review & Letters, 6(3&4) (1999), pp. 435-448.

Yamaguchi, et al., "Atomic-layer chemical-vapor-deposition of silicon dioxide films with extremely low hydrogen content", Appl. Surf. Sci., vol. 130-132 (1998) , pp. 202-207.

George, et al., "Surface Chemistry for Atomic Layer Growth", J. Phys. Chem., vol. 100 (1996), pp. 13121-13131.

George, et al., "Atomic layer controlled deposition of SiO$_2$ and Al$_2$O$_3$ using ABAB . . . binary reaction sequence chemistry", Appl. Surf. Sci., vol. 82/83 (1994), pp. 460-467.

Wise, et al., "Diethyldiethoxysilane as a new precursor for SiO$_2$ growth on silicon", Mat. Res. Soc. Symp. Proc., vol. 334 (1994), pp. 37-43.

Niinisto, et al., "Synthesis of oxide thin films and overlayers by atomic layer epitaxy for advanced applications", Mat. Sci. & Eng., vol. B41 (1996), pp. 23-29.

Min, et al., "Atomic layer deposition of TiN thin films by sequential introduction of Ti precursor and NH/sub3/", Symp.: Advanced Interconnects and Contact Materials and Processes for Future Integrated Circuits (Apr. 13-16, 1998), pp. 337-342.

Min, et al., "Metal-Organic Atomic-Layer Deposition of Titanium-Silicon-Nitride Films", Applied Physics Letters, American Inst. Of Physics, vol. 75(11) (Sep. 13, 1999).

Martensson, et al., "Atomic Layer Epitaxy of Copper on Tantalum", Chemical Vapor Deposition, 3(1) (Feb. 1, 1997), pp. 45-50.

Ritala, et al. "Atomic Layer Epitaxy Growth of TiN Thin Films", J. Electrochem. Soc., 142(8) (Aug. 1995), pp. 2731-2737.

Elers, et al., "NbCl5 As A Precursor In Atomic Layer Epitaxy", Appl. Surf. Sci., vol. 82/83 (1994), pp. 468-474.

Lee, "The Preparation of Titanium-Based Thin Film by CVD Using Titanium Chlorides as precursors", Chemical Vapor Deposition, 5(2) (Mar. 1999), pp. 69-73.

Martensson, et al., "Atomic Layer Epitaxy of Copper, Growth & Selectivity in the Cu (II)-2,2.6,6-Tetramethyl-3, 5-Heptanedion ATE/H2 Process", J. Electrochem. Soc. , 145(8) (Aug. 1998), pp. 2926-2931.

Min, et al,"Chemical Vapor Deposition of Ti-Si-N Films with Alternating Source Supply", Mat., Res. Soc. Symp. Proc., vol. 564 (Apr. 5, 1999), pp. 207-210.

Bedair, "Atomic Layer Epitaxy Deposition Processes", J. Vac. Sci. Techol. 12(1) (Jan./Feb. 1994).

Yamaga, et al., "Atomic Layer Epitaxy Of ZnS By A New Gas Supplying System In A Low-Pressure Metalorganic Vapor Phase Epitaxy", J. of Crystal Growth 117 (1992), pp. 152-155.

U.S. Appl. No. 10/762,764, filed Jan. 22, 2004.

U.S. Appl. No. 10/418,728, filed Apr. 18, 2003.

U.S. Appl. No. 09/678,266, filed Oct. 3, 2000.

U.S. Appl. No. 09/625,336, filed Jul. 25, 2000.

Ritala, et al. "Surface Roughness Reduction in Atomic Layer Epitaxy Growth of Titanium Dioxide Thin Films," Thin Solid-Films, vol. 249 No. 2 Sep. 15, 1994, pp. 155-162.

Ritala, et al. "Atomic Force Microscopy Study of Titanium Dioxide Thin Films Grown by Atomic Layer Epitaxy," Thin Solid Films, vol. 228, No. 1-2 May 15, 1993, pp. 32-35.

Ritala, et al. "Growth of Titanium Dioxide Thin Films by Atomic Layer Epitaxy," Thin Solid Films, Vo. 225, No. 1-2 Mar. 25, 1993, p. 288-95.

Ritala, et al. "Effects of Intermediate Zinc Pulses on Properties on TiN and NbN Films by Atomic Layer Epitaxy," Applied Surface Science, Vo. 120, No. 3-4 Dec. 1997, pp. 199-212.

Ritala, et al. "Atomic Layer Epitaxy Growth of TiN Thin Films from TiI$_4$ and NH$_3$," Journal Electrochemical Society, vol. 145, No. 8 Aug. 1998, pp. 2914-2920.

Martensson, et al. "Use of Atomic Layer Epitaxy for Fabrication of Si/TiN/Cu Structures," Journal Vacuum Science and Technology B, vol. 17, No. 5 Sep. 1999, pp. 2122-2128.

Proceedings of the ICEEE 1998 International Interconnect Technology Conference—San Francisco, California, Jun. 1-3, 1998.

Hwang, et al. "Nanometer-Size α-PbO$_2$-type TiO$_2$ in Garnet: A Thermobarometer for Ultrahigh-Pressure Metamorphism," Science vol. 288 Apr. 14, 2000.

* cited by examiner

ENHANCEMENT OF COPPER LINE RELIABILITY USING THIN ALD TAN FILM TO CAP THE COPPER LINE

CROSS-REFERENCE TO RELATED APPLICATIONS

This application claims benefit of U.S. provisional patent application Ser. No. 60/438,479, filed Jan. 7, 2003, which is herein incorporated by reference.

BACKGROUND OF THE INVENTION

1. Field of the Invention

Embodiments of the present invention relate to a method for manufacturing integrated circuit devices. More particularly, embodiments of the invention relate to forming thin barrier layers using cyclic or atomic layer deposition.

2. Description of the Related Art

Copper has recently become a choice metal for filling sub-micron high aspect ratio interconnect features because copper and its alloys have lower resistivities than aluminum. However, copper and its alloys have a propensity to diffuse into surrounding materials such as silicon oxide, silicon, and other dielectric materials, for example, causing an increase in the contact resistance of the circuit. Copper and its alloys also have a propensity to diffuse into surrounding elements such as transistor gates, capacitor dielectrics, transistor wells, transistor channels, electrical barrier regions, interconnects, among other known elements of integrated circuits.

FIG. 1 is a cross-sectional view of a substrate 100 including an etch stop 112 over a copper interconnect 120 in a dielectric layer 110. A barrier layer 114 is deposited prior to the deposition of copper in the interconnect to prevent or impede the diffusion of copper atoms into the surrounding dielectric layer. However, copper may still diffuse into areas surrounding the interconnect, as conventional etch stop materials, such as SiN or SiCN, do not adhere well to copper. The weak connection between the etch stop and the interconnect can result in the diffusion of metal atoms into other areas of the substrate, causing cross-talk among the interconnects of the substrate and failure of the device formed by the substrate.

There is a need, therefore, for a method for depositing an adhesive layer on metal interconnects that prevents or minimizes the diffusion of metal atoms from the interconnect.

SUMMARY OF THE INVENTION

A method for depositing a cap layer over a metal-containing interconnect by a cyclical deposition process is provided. The cap layer is formed by introducing a pulse of a metal-containing compound followed by a pulse of a nitrogen-containing compound. The cap layer provides excellent barrier properties and adheres well to the metal-containing interconnect on which it is deposited. In one aspect, the metal-containing interconnect contains copper or copper alloys, and the cap layer contains tantalum nitride.

BRIEF DESCRIPTION OF THE DRAWINGS

So that the manner in which the above recited features of the present invention are attained and can be understood in detail, a more particular description of the invention, briefly summarized above, may be had by reference to the embodiments thereof which are illustrated in the appended drawings.

It is to be noted, however, that the appended drawings illustrate only typical embodiments of this invention and are therefore not to be considered limiting of its scope, for the invention may admit to other equally effective embodiments.

DETAILED DESCRIPTION OF THE PREFERRED EMBODIMENT

Figure 1:
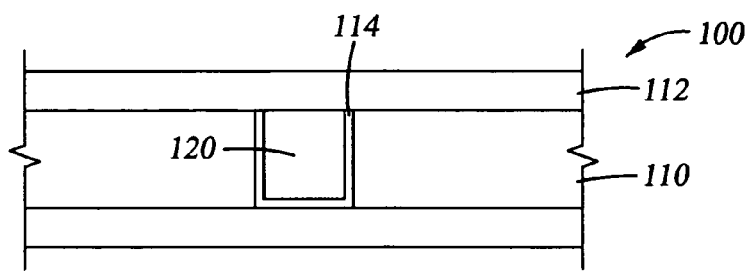
FIG. 1 illustrates a schematic, cross-sectional view of a prior art substrate.

Embodiments of the present invention generally provide a method of forming an adhesive cap layer on metal-containing interconnects and on a dielectric layer surrounding the metal-containing interconnects. In one embodiment, a cyclical deposition process is used to form a cap layer that is a refractory metal nitride layer having a thickness less than about 50 angstroms (Å), such as less than about 20 angstroms, such as from about 5 angstroms to about 20 angstroms. In one aspect of this embodiment, the refractory metal nitride layer is a tantalum nitride (TaN) layer that is preferably about 10 angstroms thick. In another embodiment, a cyclical deposition process is used to form a cap layer having a thickness that is sufficient to block diffusion of metal atoms from the underlying metal-containing interconnect.

The cap layers deposited according to the cyclical deposition techniques described herein provide excellent barrier properties. It is believed that the thin cap layers do not significantly change the dielectric constant of a device in which they are included.

The cap layers deposited according to the cyclical deposition methods described herein show evidence of an epitaxial growth phenomenon. In other words, the cap layers take on the same or substantially the same crystallographic characteristics as the underlying layer. For example, the cap layer over the metal-containing interconnect of the substrate has an ordered structure similar to the structure of the metal-containing interconnect, while the cap layer over the dielectric layer of the substrate has an amorphous structure similar to the amorphous structure of the dielectric layer. As a result, the cap layer adheres well to the metal-containing interconnect and enhances the reliability of the interconnect. The cap layer is amorphous and insulating over the dielectric layer and is thin enough that it is not expected to raise the effective dielectric constant of the dielectric layer.

A TaN cap layer is deposited by providing one or more pulses of a tantalum-containing compound at a flow rate between about 100 sccm and about 1,000 sccm for a time period of about 1.0 second or less and one or more pulses of a nitrogen-containing compound at a flow rate between about 100 sccm and about 1,000 sccm for a time period of about 1.0 second or less to a reaction zone having a substrate disposed therein. Exemplary tantalum-containing compounds include pentaethyl methylamino-tantalum (PEMAT), pentadiethylamino-tantalum (PDEAT), pentadimethylamino-tantalum (PDMAT) and any derivatives of PEMAT, PDEAT, and PDMAT. Exemplary tantalum-containing compounds also include t-butylimino tris(diethylamino) tantalum (TBTDET), t-butylimino tris(dimethylamino) tantalum (TBTDMT), bis(cyclopentadienyl) tantalum trihydride, bis(methylcyclopentadienyl) tantalum trihydride, and tantalum halides, such as $TaX_5$, where X is fluorine (F), bromine (Br) or chlorine (Cl), and/or derivatives thereof. Exemplary nitrogen-containing compounds include nitrogen gas, ammonia, hydrazine, methylhydrazine, dimethylhydrazine, t-butylhydrazine, phenylhydrazine, azoisobutane, ethylazide, and derivatives thereof.

It is to be understood that these compounds or any other compound not listed above may be a solid, liquid, or gas at room temperature. For example, PDMAT is a solid at room temperature and TBTDET is a liquid at room temperature. Accordingly, the non-gas phase precursors are subjected to a sublimation or vaporization step, which are both well known in the art, prior to introduction into the processing chamber. A carrier gas, such as argon, helium, nitrogen, hydrogen, or a mixture thereof, may also be used to help deliver the compound into the processing chamber, as is commonly known in the art.

Each pulse is performed sequentially, and is accompanied by a separate flow of non-reactive gas at a rate between about 200 sccm and about 1,000 sccm. The separate flow of non-reactive gas may be pulsed between each pulse of the reactive compounds or the separate flow of non-reactive gas may be introduced continuously throughout the deposition process. The separate flow of non-reactive gas, whether pulsed or continuous, serves to remove any excess reactants from the reaction zone to prevent unwanted gas phase reactions of the reactive compounds, and also serves to remove any reaction by-products from the processing chamber, similar to a purge gas. In addition to these services, the continuous separate flow of non-reactive gas helps deliver the pulses of reactive compounds to the substrate surface similar to a carrier gas. The term "non-reactive gas" as used herein refers to a single gas or a mixture of gases that does not participate in the metal layer formation. Exemplary non-reactive gases include argon, helium, nitrogen, hydrogen, and combinations thereof.

A "compound" is intended to include one or more precursors, reductants, reactants, and catalysts. Each compound may be a single compound or a mixture/combination of two or more compounds.

A "thin layer" as used herein refers to a layer of material deposited on a substrate surface having a thickness of about 20 angstroms or less, such as about 10 angstroms. A "feature" as used herein refers to a via, contact, line, or any other interconnect facet, e.g., vertical or horizontal interconnect, having an aspect ratio (height to width ratio) of about 4:1 or greater. A "substrate surface", as used herein, refers to any substrate surface upon which film processing is performed. For example, a substrate surface may include silicon, silicon oxide, doped silicon, germanium, gallium arsenide, glass, sapphire, and any other materials such as metals, metal alloys, and other conductive materials, depending on the application. A substrate surface may also include dielectric materials such as silicon dioxide and carbon doped silicon oxides.

"Cyclical deposition" as used herein refers to the sequential introduction of two or more compounds to deposit a thin layer on a substrate surface. The two or more compounds are sequentially introduced into a reaction zone of a processing chamber. Each compound is separated by a time delay/pause to allow each compound to adhere and/or react on the substrate surface. In one aspect, a first compound or compound A is dosed/pulsed into the reaction zone followed by a first time delay/pause. Next, a second compound or compound B is dosed/pulsed into the reaction zone followed by a second time delay. When a ternary material is desired, a third compound (C), is dosed/pulsed into the reaction zone followed by a third time delay. These sequential tandems of a pulse of reactive compound followed by a time delay may be repeated indefinitely until a desired film or film thickness is formed on the substrate surface.

A "pulse/dose" as used herein is intended to refer to a quantity of a particular compound that is intermittently or non-continuously introduced into a reaction zone of a processing chamber. The quantity of a particular compound within each pulse may vary over time, depending on the duration of the pulse. A particular compound may include a single compound or a mixture/combination of two or more compounds.

A "reaction zone" is intended to include any volume that is in fluid communication with a substrate surface being processed. The reaction zone may include any volume within a processing chamber that is between a gas source and the substrate surface. For example, the reaction zone includes any volume downstream of a dosing valve in which a substrate is disposed.

The durations for each pulse/dose are variable and may be adjusted to accommodate, for example, the volume capacity of the processing chamber as well as the capabilities of a vacuum system coupled thereto. Additionally, the dose time of a compound may vary according to the flow rate of the compound, the pressure of the compound, the temperature of the compound, the type of dosing valve, the type of control system employed, as well as the ability of the compound to adsorb onto the substrate surface. Dose times may also vary based upon the type of layer being formed and the geometry of the device being formed.

Typically, the duration for each pulse/dose or "dose time" is about 1.0 second or less. However, a dose time can range from microseconds to milliseconds to seconds, and even to minutes. In general, a dose time should be long enough to provide a volume of compound sufficient to adsorb/chemisorb onto substantially the entire surface of the substrate and form a layer of the compound thereon.

Figure 2:
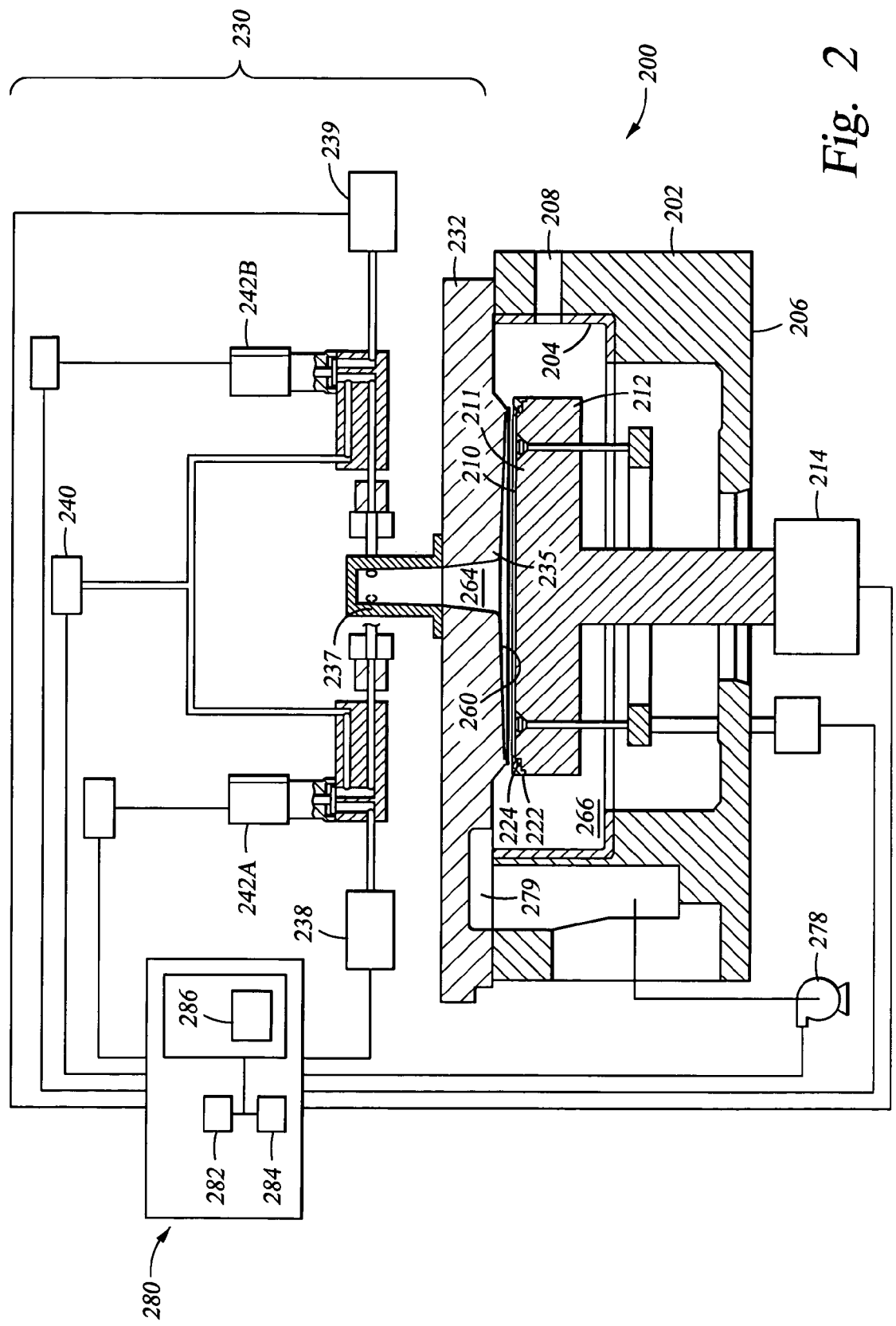
FIG. 2 illustrates a schematic, cross-sectional view of an exemplary processing chamber 200 for use in a method of forming a cap layer according to embodiments.

FIG. 2 illustrates a schematic, partial cross section of an exemplary processing chamber 200 for use in a method of forming a barrier layer according to each of the embodiments of the present invention. Such a processing chamber 200 is available from Applied Materials, Inc. located in Santa Clara, Calif., and a brief description thereof follows. A more detailed description may be found in commonly assigned U.S. patent application Ser. No. 10/032,284, entitled "Gas Delivery Apparatus and Method For Atomic Layer Deposition", filed on Dec. 21, 2001, which is incorporated herein by reference.

The processing chamber 200 may be integrated into an integrated processing platform, such as an Endura™ platform also available from Applied Materials, Inc. Details of the Endura™ platform are described in commonly assigned U.S. patent application Ser. No. 09/451,628, entitled "Integrated Modular Processing Platform", filed on Nov. 30, 1999, which is incorporated by reference herein.

The chamber 200 includes a chamber body 202 having a slit valve 208 formed in a sidewall 204 thereof and a substrate support 212 disposed therein. The substrate support 212 is mounted to a lift motor 214 disposed through the bottom 206 of the chamber body 202 to raise and lower the substrate support 212 and a substrate 210 disposed on an upper surface 211 of the substrate support 212. The substrate support 212 may also include a vacuum chuck, an electrostatic chuck, or a clamp ring for securing the substrate 212 to the substrate support 212 during processing. Further, the substrate support 212 may be heated using an embedded heating element, such as a resistive heater, or may be heated using radiant heat, such as heating lamps disposed above the substrate support 212. A purge ring 222 may be disposed on the substrate support 212 to define a purge channel 224 that provides a purge gas to prevent deposition on a peripheral portion of the substrate 210.

A gas delivery apparatus 230 is disposed at an upper portion of the chamber body 202 to provide a gas, such as a process gas and/or a purge gas, to the chamber 200. A vacuum system 278 is in communication with a pumping channel 279 to evacuate gases from the chamber 200 and to help maintain a desired pressure or a desired pressure range inside a pumping zone 266 of the chamber 200.

The gas delivery apparatus 230 includes a chamber lid 232 having an expanding channel 264 formed within a central portion thereof. The chamber lid 232 also includes a bottom surface 260 extending from the expanding channel 264 to a peripheral portion of the chamber lid 232. The bottom surface 260 is sized and shaped to substantially cover the substrate 210 disposed on the substrate support 212. The expanding channel 264 has an inner diameter that gradually increases from an upper portion 237 to a lower portion 235 adjacent the bottom surface 260 of the chamber lid 232. The velocity of a gas flowing therethrough decreases as the gas flows through the expanding channel 264 due to the expansion of the gas. The decreased gas velocity reduces the likelihood of blowing off reactants adsorbed on the surface of the substrate 210.

The gas delivery apparatus 230 also includes at least two high speed actuating valves 242A, 242B having one or more ports. At least one valve 242A, 242B is dedicated to each reactive compound. For example, a first valve is dedicated to a refractory metal-containing compound, such as tantalum and a second valve is dedicated to a nitrogen-containing compound. When a ternary material is desired, a third valve is dedicated to an additional compound.

The valves 242A, 242B may generally be any type of valve capable of reliably, repeatedly, and precisely metering the desired precursors at the desired rate of introduction. In some cases, dosing may be as fast as 1-2 milliseconds (msec). As one example, the valves 242A, 242B may be electronically controlled (EC) valves, which are commercially available from Fujikin of Japan as part number FR-21-6.35 UGF-APD. The valves 242A, 242B precisely and repeatedly deliver short pulses of the reactive compounds into the chamber body 202. The valves 242A, 242B can be directly controlled by a system computer, such as a mainframe for example, or controlled by a chamber/application specific controller; such as a programmable logic computer (PLC) which is described in more detail in the co-pending U.S. patent application Ser. No. 09/800,881, entitled "Valve Control System For ALD Chamber", filed on Mar. 7, 2001, which is incorporated by reference herein.

An exemplary process for forming a TaN cap layer on a 200 mm wafer using a cyclical deposition process of alternate/sequential pulses of PDMAT and ammonia is described below. The process may be performed within a processing chamber, such as the processing chamber 200 described in FIG. 1. PDMAT is a preferred tantalum-containing compound for a number of reasons. PDMAT is relatively stable, and has a vapor pressure which makes it easy to deliver. PDMAT may also be produced with a low halide content, such as less than 100 ppm, and may even be produced with a halide content of less than 30 ppm or even less than 5 ppm. Not wishing to be bound by theory, it is believed that an organo-metallic precursor with a low halide content is beneficial because halides (such as chlorine) incorporated in the cap layer may attack an adjacent copper layer.

To deposit the TaN layer, an inert/purge gas such as argon is first introduced into the processing chamber 200 to stabilize the pressure and temperature therein. This separate flow of an inert/purge gas flows continuously during the deposition process such that only the separate flow of an inert/purge gas flows between pulses of each compound. After the chamber pressure and temperature have been stabilized between about 150° C. and about 350° C. at about 0.5 Torr to about 5 Torr, a first pulse of PDMAT is provided from the gas source 238 at a flow rate between about between about 100 sccm and about 400 sccm, with a pulse time of about 0.6 seconds or less. A pulse of ammonia is then provided from the gas source 239 at a flow rate between about 200 sccm and about 600 sccm, with a pulse time of about 0.6 seconds or less.

A pause between pulses of PDMAT and ammonia is about 1.0 second or less, about 0.5 seconds or less, or about 0.1 seconds or less. A pause after the pulse of ammonia is also about 1.0 second or less, about 0.5 seconds or less, or about 0.1 seconds or less. Argon gas flowing between about 100 sccm and about 1,000 sccm, such as between about 100 sccm and about 400 sccm, is continuously provided from the gas source 240 through each valve 242A, 242B. In one aspect, at least a portion of a pulse of PDMAT may still be in the chamber when at a least a portion of a pulse of ammonia enters so that some co-reaction, e.g., a gas phase co-reaction, takes place. In another aspect, the duration of the purge gas and/or pump evacuation is designed to prevent the pulses of PDMAT and ammonia from mixing together in the reaction zone.

The heater temperature is maintained between about 150° C. and about 350° C. at a chamber pressure between about 0.5 and about 5.0 Torr. Each cycle consisting of a pulse of PDMAT, pause, pulse of ammonia, and pause provides a tantalum nitride layer having a thickness between about 0.3 Å and about 1.0 Å. The alternating sequence may be repeated until the desired thickness is achieved, which is less than about 20 Å, such as about 10 Å. Accordingly, the deposition method requires between 10 and 70 cycles, more typically between 20 and 30 cycles.

Figure 3A:
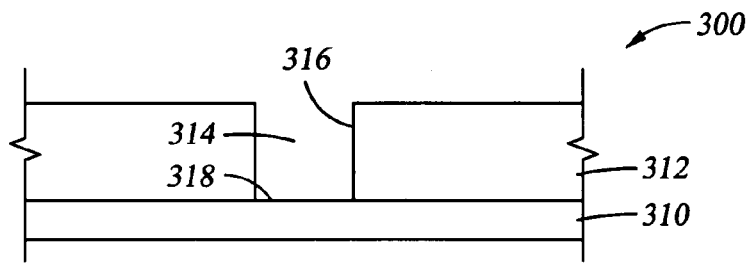
FIGS. 3A-3E are cross-sectional views of a substrate illustrating steps in an embodiment of a method for forming a cap layer deposited in accordance with embodiments of a cyclical deposition technique described herein.

FIGS. 3A-3E are cross sectional views of a substrate at different stages of a multi-layer metal interconnect fabrication sequence incorporating a thin cap layer deposited using a cyclical deposition process described herein. FIG. 3A shows an underlying layer 310, such as a lower. level metal interconnect, of substrate 300 having a dielectric layer 312 formed thereon. The dielectric layer 312 may be any dielectric material including a low k dielectric material, whether presently known or yet to be discovered. For example, the dielectric layer 312 may be a silicon oxide or a carbon doped silicon oxide, for example. The dielectric layer 312 has been etched to form a feature 314, such as a hole, therein using conventional and well-known techniques. The feature 314 may be a plug, via, contact, line, wire, or any other interconnect component. The feature 314 has vertical sidewalls 316 and a bottom 318, typically having an aspect ratio of 4:1 or greater, such as 6:1. The bottom 318 exposes at least a portion of the underlying layer 310.

Figure 3B:
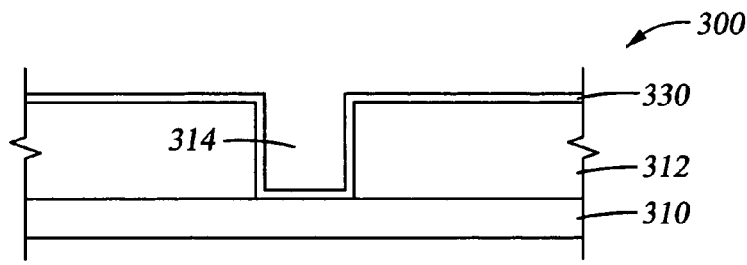

Referring to FIG. 3B, a barrier layer 330 is deposited on the bottom 318 as well as the side walls 316 of the feature 314. Preferably, the barrier layer 330 has a thickness less than about 20 Å, more preferably, a thickness of about 10 Å. The barrier layer may be deposited by CVD, PVD, a cyclical deposition process as described herein, or combinations thereof. The barrier layer may include TaN, Ta TiSiN, tungsten (W), tungsten nitride ($WN_x$) or combinations thereof, such as a layer of TaN and a layer of Ta. The barrier layer 330 prevents or minimizes diffusion of material subsequently deposited in the feature 314 into the dielectric layer 312.

Optionally, the patterned or etched substrate dielectric layer 312 may be cleaned to remove native oxides or other contaminants from the surface thereof prior to depositing the barrier layer 330. For example, reactive gases may be excited into a plasma within a remote plasma source chamber and delivered to the processing chamber 200. An exemplary remote plasma chamber is a Reactive Pre-clean II chamber available from Applied Materials, Inc., located in Santa Clara, Calif. Alternatively, the processing chamber 200 may be modified to deliver the pre-cleaning gas plasma through existing gas inlets.

In one aspect, the reactive pre-clean process forms radicals from a plasma of one or more reactive gases such as argon, helium, hydrogen, nitrogen, fluorine-containing compounds, and combinations thereof. For example, a reactive gas may include a mixture of tetrafluorocarbon ($CF_4$) and oxygen ($O_2$), or a mixture of helium (He) and nitrogen trifluoride ($NF_3$).

The plasma is typically generated by applying a power of about 500 to 2,000 watts RF at a frequency of about 200 KHz to 114 MHz. The flow of reactive gases ranges between about 100 and about 1,000 sccm and the plasma treatment lasts for about 10 to about 150 seconds. Preferably, the plasma is generated in one or more treatment cycles and purged between cycles. For example, four treatment cycles lasting 35 seconds each is effective.

In another aspect, the patterned or etched dielectric layer 112 may be pre-cleaned first using an argon plasma and then a hydrogen plasma. A processing gas having greater than about 50% argon by number of atoms is introduced at a pressure of about 0.8 mTorr. A plasma is struck to subject the dielectric layer 112 to an argon sputter cleaning environment. The argon plasma is preferably generated by applying between about 50 watts and about 500 watts of RF power. The argon plasma is maintained for between about 10 seconds and about 300 seconds to provide sufficient cleaning time for the deposits that are not readily removed by a reactive hydrogen plasma. Following the argon plasma, the chamber pressure is increased to about 140 mTorr, and a processing gas consisting essentially of hydrogen and helium is introduced into the processing region. Preferably, the processing gas comprises about 5% hydrogen and about 95% helium. The hydrogen plasma is generated by applying between about 50 watts and about 500 watts power. The hydrogen plasma is maintained for about 10 seconds to about 300 seconds.

Figure 3C:
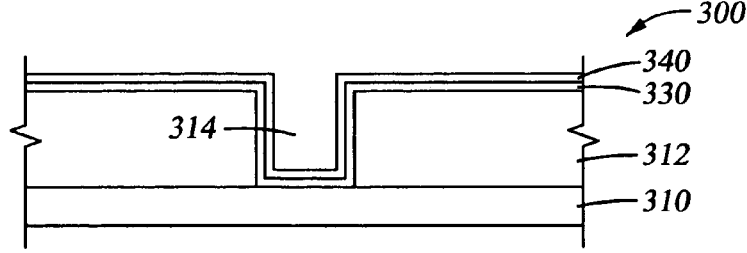

Referring to FIG. 3C, a metal-containing seed layer 340, such as a metal, metal alloy, or a combination thereof is deposited over the barrier layer 330 to at least partially fill the feature 314. In one aspect, a metal seed layer 340 of a copper-containing material is first deposited having a thickness of about 1,000 Å to about 2,000 Å before a metal-containing layer 342, such as a copper layer, is deposited over the seed layer 340 to fill the feature 314, as shown in FIG. 3D.

In one aspect, the metal-containing seed layer 340 is deposited using high density plasma physical vapor deposition (HDP-PVD) to enable good conformal coverage. One example of a HDP-PVD chamber is the Ionized Metal Plasma (IMP) Vectra™ chamber, available from Applied Materials, Inc. of Santa Clara, Calif. The IMP chamber may also be integrated into an Endura™ platform, also available from Applied Materials, Inc. Of course, other techniques, such as physical vapor deposition, chemical vapor deposition, electroless plating, and electroplating, may be used.

The IMP chamber includes a target, coil, and biased substrate support member. To form the seed layer 340, a power between about 0.5 kW and about 5 kW is applied to the target, and a power between about 0.5 kW and 3 kW is applied to the coil. A power between about 200 and about 500 W at a frequency of about 13.56 MHz is applied to bias the substrate. Argon is flowed into the chamber at a rate of about 35 sccm to about 85 sccm, and nitrogen may be added to the chamber at a rate of about 5 sccm to about 100 sccm. The substrate support member is heated to a temperature between about 50° C. and 250° C. as the pressure of the chamber is typically between about 5 mTorr to about 100 mTorr.

Figure 3D:
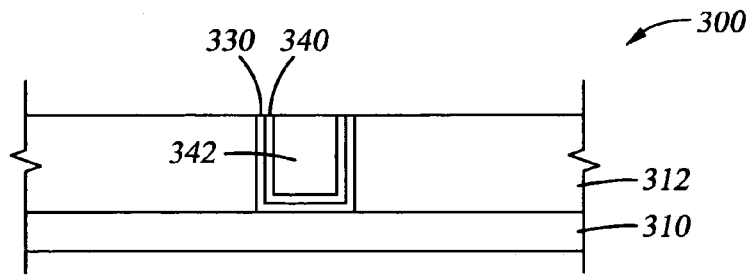

Referring to FIG. 3D, the metal-containing layer 342 may be deposited over the seed layer 340 using CVD, PVD, electroless, or electroplating techniques. In one aspect, a copper layer 342 is formed using an electroplating cell, such as the Electra™ Cu ECP system, available from Applied Materials, Inc., of Santa Clara, Calif. The Electra™ Cu ECP system may also be integrated into an Endura™ platform also available from Applied Materials, Inc. A copper electrolyte solution and copper electroplating technique is described in commonly assigned U.S. Pat. No. 6,113,771, entitled "Electro-deposition Chemistry", which is incorporated by reference herein. Typically, the electroplating bath has a copper concentration greater than about 0.7M. The electroplating bath may also contain various additives as is well known in the art. The temperature of the bath is between about 15° C. and about 25° C. The bias is between about −15 volts to about 15 volts. In one aspect, the positive bias ranges from about 0.1 volts to about 10 volts and the negatives bias ranges from about −0.1 to about −10 volts.

While FIG. 3D shows a metal-containing seed layer 340 underlying the metal-containing layer 342 that fills the feature 314, the metal-containing layer 342 may be deposited on the barrier layer 330 without an underlying seed layer by a technique such as PVD, CVD, electroplating, electroless plating, and combinations thereof.

Following the deposition of the metal-containing layer, the top portion of the resulting substrate may be planarized, as shown in FIG. 3D. A chemical mechanical planarizing (CMP) apparatus may be used, such as the Mirra™ System available from Applied Materials, Santa Clara, Calif., for example. For example, portions of the metal-containing layers 340, 342 and the dielectric layer 312 are removed from the top of the structure leaving a fully planar surface. Optionally, the intermediate surfaces of the structure may be planarized between the deposition of the subsequent layers described above.

Optionally, an anneal treatment may be performed following chemical mechanical polishing whereby the substrate is subjected to a temperature between about 100° C. and about 400° C. for about 10 minutes to about 1 hour, preferably about 30 minutes. A non-reactive gas such as helium, hydrogen, nitrogen, or a mixture thereof is introduced at a rate of 100 to about 10,000 sccm. The chamber pressure is maintained between about 2 Torr and about 10

Torr. The RF power is about 200 W to about 1,000 W at a frequency of about 13.56 MHz, and the preferable substrate spacing is between about 300 mils and about 800 mils.

Figure 3E:
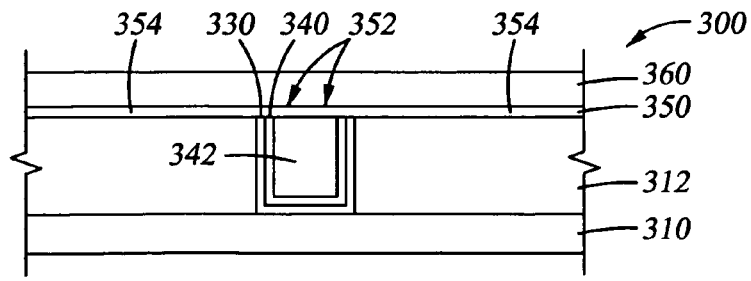

A cap layer 350 is then deposited on the substrate, as shown in FIG. 3E. The cap layer 350 is deposited by a cyclical deposition process described herein. For example, the cap layer may be a tantalum nitride layer about 10 angstroms thick. It is believed that the region 352 of the cap layer 350 over the metal-containing layer 342 has a structure similar to the structure of the metal-containing layer 342, while the region 354 of the cap layer 350 over the dielectric layer 312 has a structure similar to the structure of the dielectric layer 312.

In one embodiment, an etch stop layer 360, such as a SiN layer or a SiCN layer, is then deposited on the cap layer 350. The etch stop layer 360 may be deposited by PVD, CVD, other deposition techniques, or combinations thereof. Additional layers (not shown), such as dielectric layers and metal-containing layers, may be deposited on the etch stop layer 360.

Figure 4A:
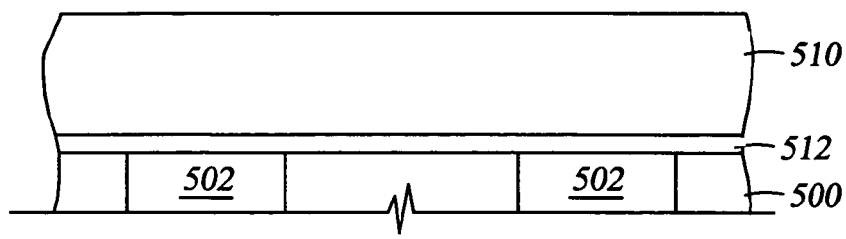
FIGS. 4A-4I are cross-sectional views of a substrate illustrating steps in an embodiment of a dual damascene deposition sequence.

A preferred method for making a dual damascene structure including the cap layer described herein is sequentially depicted in FIGS. 4A-4I, which are cross sectional views of a substrate having the steps of an embodiment performed thereon. As shown in FIG. 4A, an initial first dielectric layer 510, such as a low dielectric constant film, is deposited on a liner or barrier layer 512 to a thickness, such as between about 5,000 Å and about 10,000 Å, depending on the size of the structure to be fabricated. The liner layer 512 may be a silicon carbide layer which may be doped with oxygen or nitrogen. The liner/barrier layer 512 may alternatively comprise another material, such as silicon nitride, which minimizes the oxidation of conductive materials, such as copper, which may comprise conductive features 502 previously formed in the substrate 500.

Figure 4B:
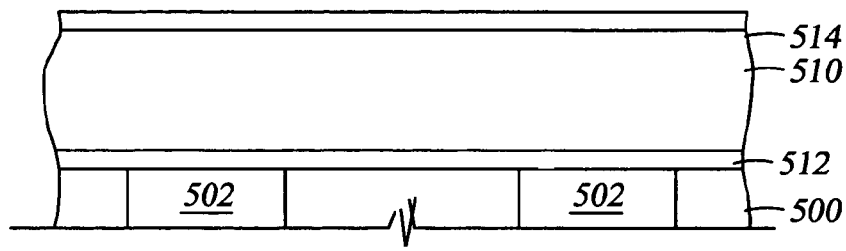
Figure 4C:
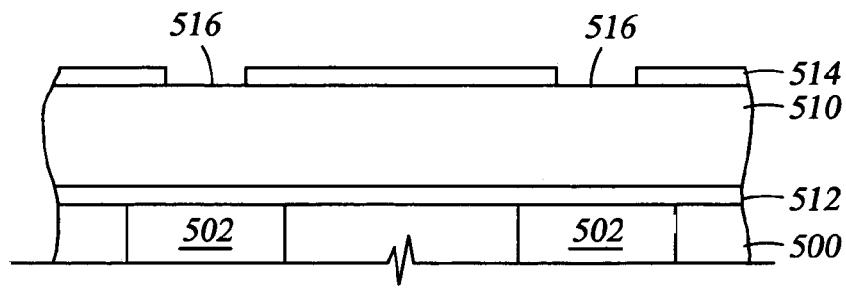

As shown in FIG. 4B, an etch stop layer 514, which may be a silicon carbide layer or doped silicon carbide layer is then deposited on the first dielectric layer to a thickness, such as between about 200 and about 1000 Å using RF power in the range between about 10 and about 1000 watts for a 200 mm substrate. The etch stop layer 514 is then pattern etched to define the contact/via openings 516 and to expose first dielectric layer 510 in the areas where the contacts/vias are to be formed as shown in FIG. 4C. Preferably, the etch stop layer 514 is pattern etched using conventional photolithography and etch processes.

Figure 4D:
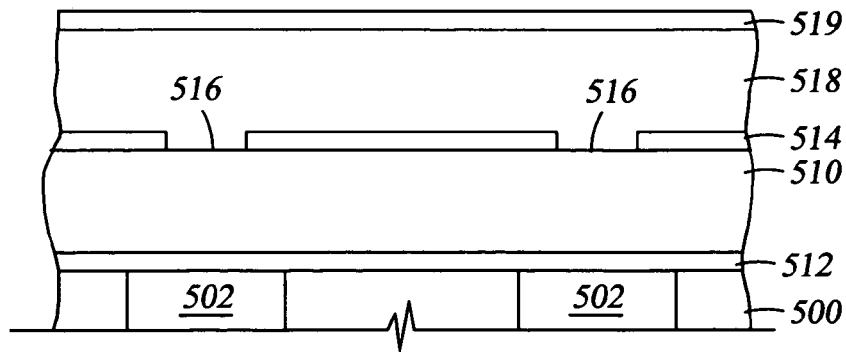

After the etch stop layer 514 has been etched to pattern the contacts/vias 516 and the photo resist has been removed, a second dielectric layer 518 is deposited over the first cap layer 514 to a thickness, such as between about 5,000 Å and about 10,000 Å as described for the first dielectric layer 510 as shown in FIG. 4D.

Figure 4E:
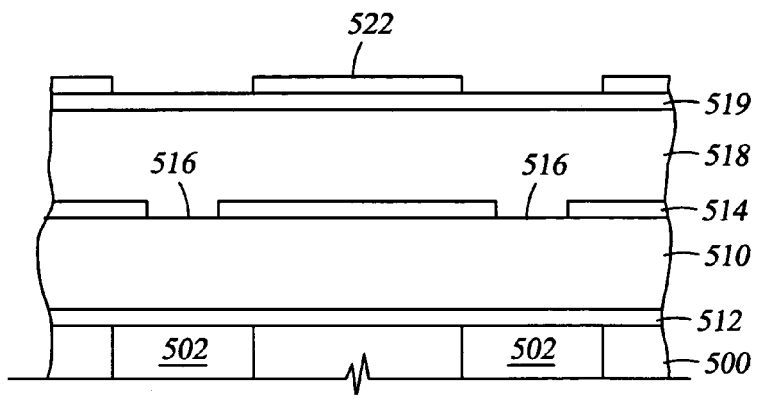
Figure 4F:
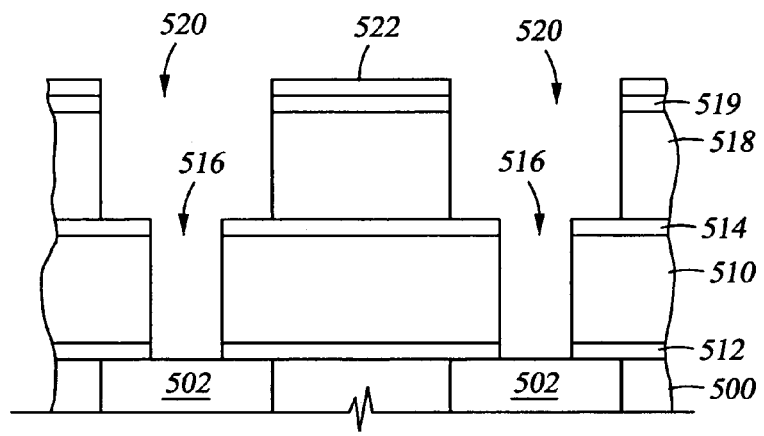

A second etch stop layer 519, which may be a silicon carbide layer or doped silicon carbide layer is then deposited on the second dielectric layer 518 to a thickness, such as of about 200 to about 1000 Å. The silicon carbide material may be doped with oxygen or nitrogen. A photoresist 522 deposited on second etch stop layer 519 is then patterned, as shown in FIG. 4E. Lines 520 and contacts/vias 516 are then etched using reactive ion etching or other anisotropic etching techniques to define the metallization structure (i.e., the openings for the lines and contact/via) and expose the conductive feature 502 as shown in FIG. 4F. Any photoresist 522 or other material used to pattern and etch the second cap layer 519 is removed using an oxygen strip or other suitable process.

Following etching of the deposited material and removal of photo resist materials, exposed portions of the second etch stop layer 519, the second dielectric layer 518, the first etch stop layer 514, the first dielectric layer 510, and the liner or barrier layer 512 may be treated with a reactive pre-clean process, as described above, to remove contaminants, particulate matter, residues, and oxides that may have formed on the exposed portions of the contact/via openings 516, the line openings 520, and the conductive feature 502.

Figure 4G:
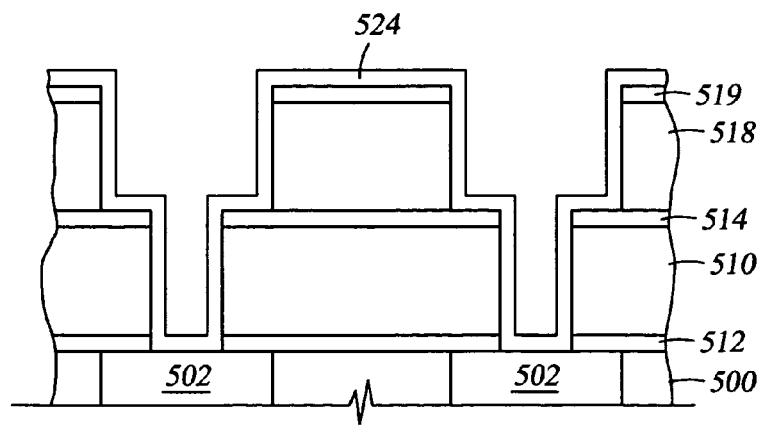
Figure 4H:
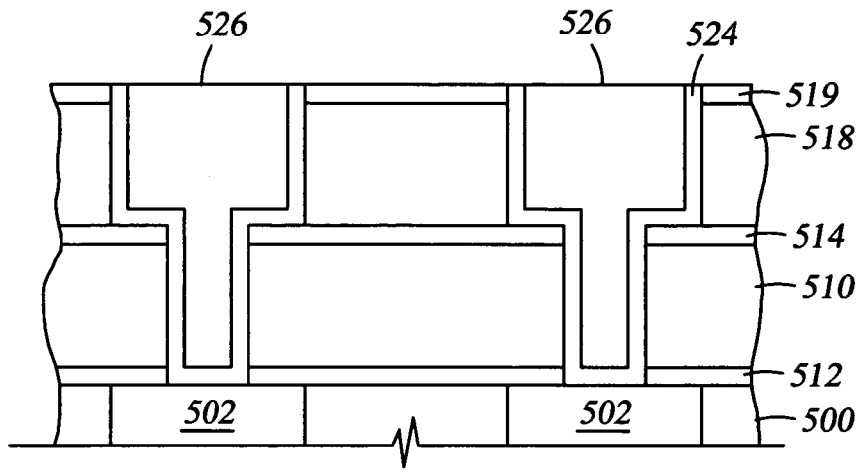

The metallization structure is then formed with a conductive material such as aluminum, copper, tungsten or combinations thereof. Presently, the trend is to use copper to form the smaller features due to the low resistivity of copper (1.7 $\Omega$-cm compared to 5.1 $\Omega$-cm for aluminum). Preferably, as shown in FIG. 4G, a conductive barrier layer 524 is first deposited conformably in the metallization pattern to prevent copper migration into the surrounding silicon and/or dielectric material. Barrier layers include titanium, titanium nitride, tantalum, tantalum nitride, and combinations thereof, among other conventional barrier layer materials. Thereafter, copper 526 is deposited using either chemical vapor deposition, physical vapor deposition, electroplating, or combinations thereof to form the conductive structure. Once the structure has been filled with copper or other metal, the surface is planarized using chemical mechanical planarizing as shown in FIG. 4H.

Optionally, the structure may be annealed after chemical mechanical polishing, as described above.

Figure 4I:
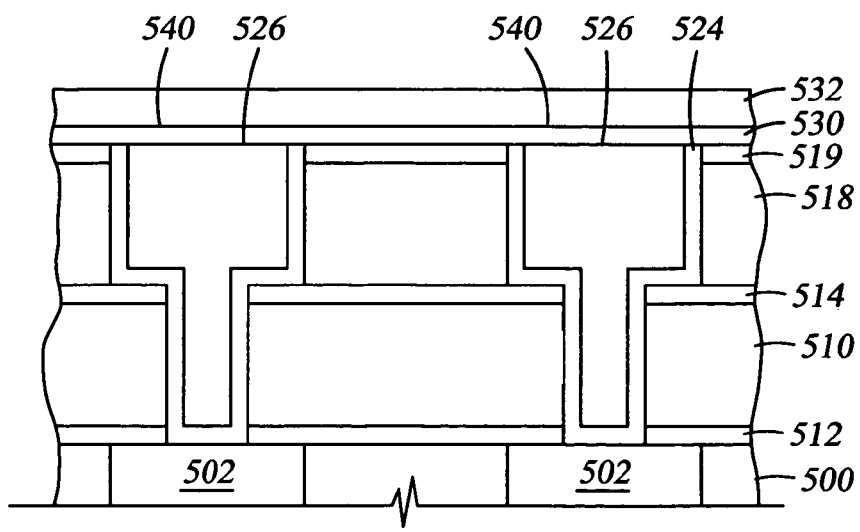

A cap layer 530 is then deposited on the structure, as shown in FIG. 4I. The cap layer 530 is deposited by a cyclical deposition process described herein. For example, the cap layer may be a tantalum nitride layer about 10 angstroms thick. It is believed that the region 540 of the cap layer over the metal-containing layer 526 has a structure similar to the structure of the metal-containing layer 526.

In one embodiment, an etch stop layer 532, such as a SiN layer or a SiCN layer, is then deposited on the cap layer 530, as shown in FIG. 4I. The etch stop layer 532 may be deposited by PVD, CVD, other deposition techniques, or combinations thereof. Additional layers (not shown), such as dielectric layers and metal-containing layers, may be deposited on the etch stop layer 532.

As stated above, the processing steps of the embodiments described herein may be performed in an integrated processing platform such as the Endura™ platform available from Applied Materials, Inc. of Santa Clara, Calif. To facilitate the control and automation of the overall system, the integrated processing system may include a controller 280 comprising a central processing unit (CPU) 282, memory 284, and support circuits 286. The CPU 282 may be one of any form of computer processors that are used in industrial settings for controlling various drives and pressures. The memory 284 is connected to the CPU 282, and may be one or more of a readily available memory such as random access memory (RAM), read only memory (ROM), floppy disk, hard disk, or any other form of digital storage, local or remote. Software instructions and data can be coded and stored within the memory 284 for instructing the CPU 282. The support circuits 286 are also connected to the CPU 282 for supporting the processor 282 in a conventional manner. The support circuits 286 may include cache, power supplies, clock circuits, input/output circuitry, subsystems, and the like.

While the foregoing is directed to embodiments of the present invention, other and further embodiments of the invention may be devised without departing from the basic scope thereof, and the scope thereof is determined by the claims that follow.

What is claimed is:

1. A method for forming a cap layer, comprising:
depositing a barrier layer in a feature in a dielectric layer of a substrate;
filling the feature with a metal-containing layer;
planarizing the substrate to create a planar surface comprising a surface of the dielectric layer and a surface of the metal-containing layer; and
depositing a refractory metal nitride cap layer on the planar surface of the substrate by a cyclical deposition process comprising alternately pulsing a metal-containing compound and a nitrogen-containing compound to deposit the refractory metal nitride cap layer.

2. The method of claim 1, wherein the refractory metal nitride cap layer comprises tantalum nitride.

3. The method of claim 1, wherein the pulsing is continued until the refractory metal nitride cap layer has a crystalline like structure over the metal-containing layer.

4. The method of claim 1, wherein the pulsing occurs at a pressure between about 0.5 Torr and about 5 Torr at a temperature between about 150° C. and about 350° C.

5. The method of claim 1, wherein the pulsing is repeated until the refractory metal nitride cap layer has a thickness of about 10 angstroms.

6. The method of claim 1, wherein the pulsing is repeated until the refractory metal nitride cap layer has a thickness of from about 5 angstroms to about 20 angstroms.

7. The method of claim 1, further comprising flowing a non-reactive gas continuously during the pulsing of the metal-containing compound and the pulsing of the nitrogen-containing compound.

8. The method of claim 1, wherein the pulsing of the metal-containing compound and the pulsing of the nitrogen-containing compound are separated by a time delay.

9. The method of claim 1, wherein the refractory metal nitride cap layer has a thickness sufficient to block diffusion of metal atoms from the metal-containing layer.

10. The method of claim 1, further comprising depositing an etch stop layer on the refractory metal nitride cap layer.

11. A method for processing a substrate, comprising:
depositing a barrier layer in a feature in a dielectric layer of a substrate;
filling the feature with a metal-containing layer;
planarizing the substrate to create a planar surface comprising a surface of the dielectric layer and a surface of the metal-containing layer;
depositing a cap layer comprising tantalum nitride on the planar surface of the substrate by a cyclical deposition process comprising alternately pulsing a tantalum-containing compound and a nitrogen-containing compound to deposit the cap layer; and
depositing an etch stop layer on the cap layer.

12. The method of claim 11, wherein the pulsing is continued until the cap layer has a crystalline like structure over the metal-containing layer.

13. The method of claim 11, wherein the pulsing is repeated until the cap layer has a thickness of from about 5 angstroms to about 20 angstroms.

14. The method of claim 11, further comprising flowing a non-reactive gas continuously during the pulsing of the tantalum-containing compound and the pulsing of the nitrogen-containing compound.

15. The method of claim 11, wherein the pulsing of the tantalum-containing compound and the pulsing of the nitrogen-containing compound are separated by a time delay.

16. The method of claim 11, wherein the cap layer has a thickness sufficient to block diffusion of metal atoms from the metal-containing layer.

17. A method of forming a dual damascene structure, comprising:
depositing a first dielectric film on a substrate;
depositing an etch stop on the first dielectric film;
pattern etching the etch stop to define a vertical interconnect opening and expose the first dielectric film;
depositing a second dielectric film on the etch stop and the exposed first dielectric film;
pattern etching the second dielectric film to define a horizontal interconnect and continuing to etch the exposed first dielectric film to define the vertical interconnect;
depositing a barrier layer on the substrate;
depositing a metal-containing layer on the substrate to fill both the vertical interconnect and the horizontal interconnect;
planarizing the metal-containing layer and the second dielectric film;
depositing a refractory metal nitride cap layer on the planarized metal-containing layer and the planarized second dielectric film by a cyclical deposition process comprising alternately pulsing a metal-containing compound and a nitrogen-containing compound to deposit the refractory metal nitride cap layer; and
depositing an etch stop layer on the refractory metal nitride cap layer.

18. The method of claim 17, wherein the refractory metal nitride cap layer comprises tantalum nitride.

19. The method of claim 17, wherein the pulsing is continued until the refractory metal nitride cap layer has a crystalline like structure over the metal-containing layer.

20. The method of claim 17, wherein the pulsing is repeated until the refractory metal nitride cap layer has a thickness of from about 5 angstroms to about 20 angstroms.

21. The method of claim 17, further comprising flowing a non-reactive gas continuously during the pulsing of the metal-containing compound and the pulsing of the nitrogen-containing compound.

22. The method of claim 17, wherein the pulsing of the metal-containing compound and the pulsing of nitrogen-containing compound are separated by a time delay.

23. The method of claim 17, wherein the refractory metal nitride cap layer has a thickness sufficient to block diffusion of metal atoms from the metal-containing layer.

* * * * *

UNITED STATES PATENT AND TRADEMARK OFFICE
CERTIFICATE OF CORRECTION

PATENT NO. : 7,262,133 B2 Page 1 of 1
APPLICATION NO. : 10/741824
DATED : August 28, 2007
INVENTOR(S) : Ling Chen and Mei Chang It is certified that error appears in the above-identified patent and that said Letters Patent is hereby corrected as shown below:

On the title page, item [56] In the references cited, U S Patents Documents:

Delete: "4,859,307 8/1989 Nishizawa et al"
Insert: --4,859,625 8/1989 Nishizawa et al--

Add:

--US 5,904,565 5/1999 Nguyen et al--

--20020003403A1 1/2002 Ghosh et al--

--JP2001-240972 9/2001 Kazue et al--

Signed and Sealed this

Eighth Day of December, 2009

David J. Kappos
*Director of the United States Patent and Trademark Office*